(12) United States Patent
Miyazato et al.

(10) Patent No.: US 12,408,416 B2
(45) Date of Patent: Sep. 2, 2025

(54) SILICON CARBIDE SEMICONDUCTOR DEVICE AND METHOD OF MANUFACTURING A SILICON CARBIDE SEMICONDUCTOR DEVICE

(71) Applicant: FUJI ELECTRIC CO., LTD., Kawasaki (JP)

(72) Inventors: Masaki Miyazato, Matsumoto (JP); Makoto Utsumi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 525 days.

(21) Appl. No.: 17/566,456

(22) Filed: Dec. 30, 2021

(65) Prior Publication Data

US 2022/0254916 A1 Aug. 11, 2022

(30) Foreign Application Priority Data

Feb. 8, 2021 (JP) ................. 2021-018623

(51) Int. Cl.
*H01L 29/78* (2006.01)
*H01L 21/66* (2006.01)
(Continued)

(52) U.S. Cl.
CPC .......... *H10D 84/144* (2025.01); *H01L 22/14* (2013.01); *H10D 12/031* (2025.01);
(Continued)

(58) Field of Classification Search
CPC . H01L 29/7805; H01L 22/14; H01L 29/1095; H01L 29/1608; H01L 29/66068;
(Continued)

(56) References Cited

U.S. PATENT DOCUMENTS 9,685,333 B2 * 6/2017 Nakajima ............. H01L 21/304
2006/0038206 A1 2/2006 Shimoyama et al.
(Continued)

FOREIGN PATENT DOCUMENTS

JP 2006156926 A 6/2006
JP 2006317346 A 11/2006
(Continued)

OTHER PUBLICATIONS

Japanese Office Action dated Nov. 12, 2024, in the counterpart Patent Application No. 2021-018623.

*Primary Examiner* — Ori Nadav
(74) *Attorney, Agent, or Firm* — Rabin & Berdo, P.C.

(57) ABSTRACT

Back-surface roughness of a back surface of a silicon carbide semiconductor device having a MOS gate structure in a first region that is a region within 30 μm of a cross section (lateral surface) of the device is at most 4 μm while the back-surface roughness in a second region other than the first region is at most 2 μm, the back surface of the silicon carbide semiconductor device is the back surface of the second electrode. In a method of manufacture, the back-surface roughness of the device is specified to meet a predetermined condition. Then, ON voltages of the device before and after a forward current is passed through body diodes of the device are measured, and a rate of change of the ON voltage while the forward current is passed through body diodes is calculated, and then the device having a calculated rate of change less than 3% is identified.

7 Claims, 8 Drawing Sheets

(51) Int. Cl.
*H10D 12/01* (2025.01)
*H10D 30/66* (2025.01)
*H10D 62/17* (2025.01)
*H10D 62/832* (2025.01)
*H10D 84/00* (2025.01)

(52) U.S. Cl.
CPC ......... *H10D 30/668* (2025.01); *H10D 62/393* (2025.01); *H10D 62/8325* (2025.01)

(58) Field of Classification Search
CPC ............. H01L 29/7813; H01L 29/0623; H01L 29/0878; G01R 31/2601
USPC ........................................................ 257/77
See application file for complete search history.

(56) References Cited

U.S. PATENT DOCUMENTS

| | | |
|---|---|---|
| 2015/0287597 A1 | 10/2015 | Kitabayashi |
| 2016/0056041 A1 | 2/2016 | Tamaso et al. |
| 2016/0204220 A1 | 7/2016 | Wada et al. |
| 2020/0292612 A1 | 9/2020 | Miyazato |

FOREIGN PATENT DOCUMENTS

| | | | | |
|---|---|---|---|---|
| JP | 2014139972 A | | 7/2014 | |
| JP | 2015041678 A | | 3/2015 | |
| JP | 2016046310 A | | 4/2016 | |
| JP | 2016157803 A | | 9/2016 | |
| JP | 2018205252 A | * | 12/2018 | ........... G02F 1/3137 |
| JP | 2019-021740 A | | 2/2019 | |
| JP | 2020150181 A | | 9/2020 | |

\* cited by examiner

|  |  | RT MEASUREMENT | | |
|---|---|---|---|---|
|  |  | CONVENTIONAL | FIRST EMBODIMENT | SECOND EMBODIMENT |
| NUMBER OF EVALUATED CHIPS | | 15 | | 20 |
| Von [V] | | 1.15~1.32 | 1.13~1.32 | 1.15~1.32 |
|  | σ | 1.79% | 1.09% | 0.55% |
|  | MAX-MIN | 20.36% | 12.18% | 2.53% |
| NUMBER OF MEASUREMENTS | | 57 | | 46 |

SILICON CARBIDE SEMICONDUCTOR DEVICE AND METHOD OF MANUFACTURING A SILICON CARBIDE SEMICONDUCTOR DEVICE

CROSS REFERENCE TO RELATED APPLICATIONS

This application is based upon and claims the benefit of priority of the prior Japanese Patent Application No. 2021-018623, filed on Feb. 8, 2021, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs and are difficult to adapt for large current but can be switched at high speeds up to about several MHz.

There is a strong demand in the market for large-current, high-speed power semiconductor devices. Thus, IGBTs and power MOSFETs have been intensively developed and improved, and the performance of power devices has substantially reached theoretical limit determined by the material. In terms of power semiconductor devices, semiconductor materials to replace silicon have been investigated and silicon carbide (SiC) has been focused on as a semiconductor material enabling fabrication (manufacture) of a next-generation power semiconductor device having low ON voltage, high-speed characteristics, and high-temperature characteristics.

SiC is a very stable material chemically, has a wide bandgap of 3 eV, and can be used very stably as a semiconductor material even at high temperatures. Further, SiC has a critical electric field strength that is at least ten times that of silicon and therefore, is expected to be a semiconductor material capable of sufficiently reducing ON resistance. Such characteristics of silicon carbide are also applicable to other semiconductors having a bandgap wider than that of silicon, such as, for example, gallium nitride (GaN). Therefore, use of a wide bandgap semiconductor enables high withstand voltage for semiconductor devices.

SiC is a very stable material chemically, has a wide bandgap of 3 eV, and can be used very stably as a semiconductor material even at high temperatures. Further, SiC has a critical electric field strength that is ten times that of silicon or greater, and has a high possibility of exceeding the material limit of silicon. Therefore, future growth is strongly expected for power semiconductor applications, particularly MOSFETs. In particular, ON resistance thereof is expected to be small. Vertical SiC-MOSFETs having even lower ON resistance while maintaining high voltage characteristics can be expected.

Figure 9:
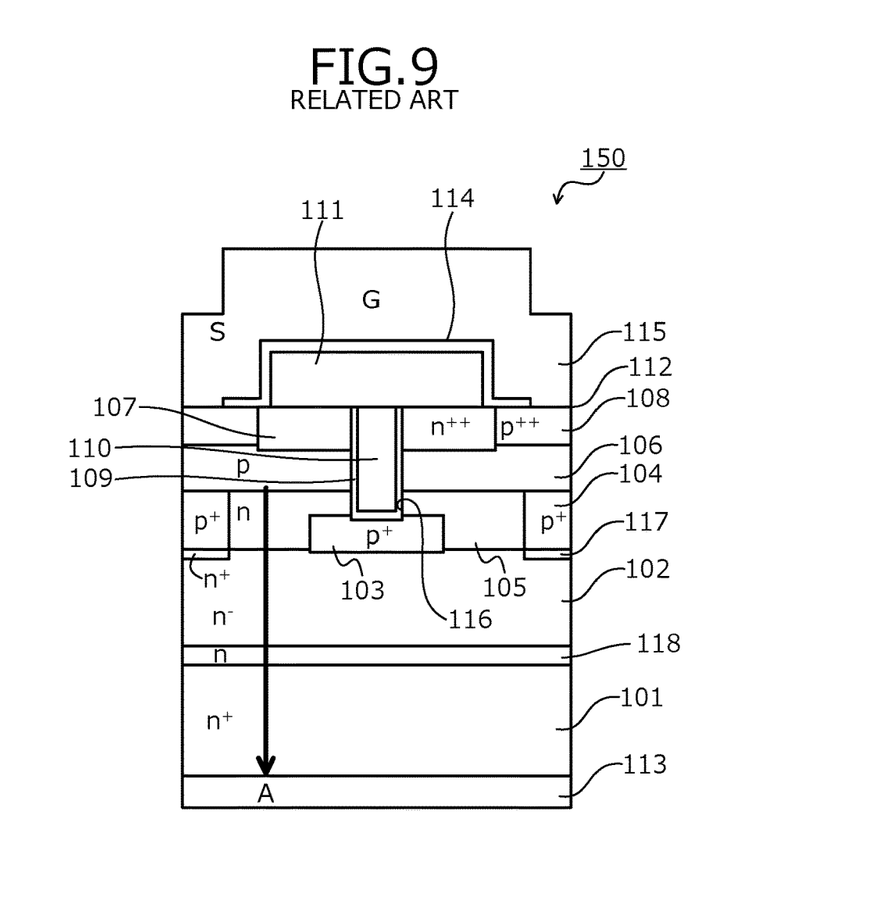
FIG. 9 is a cross-sectional view depicting a structure of a conventional silicon carbide semiconductor device.

A structure of a conventional silicon carbide semiconductor device is described taking a vertical MOSFET as an example. FIG. 9 is a cross-sectional view depicting the structure of the conventional silicon carbide semiconductor device. FIG. 9 is an example of a trench-type MOSFET 150. As depicted in FIG. 9, an n-type buffer layer 118 is deposited on a front surface of an $n^+$-type silicon carbide substrate 101, and an $n^-$-type silicon carbide epitaxial layer 102 is deposited on a front surface of the n-type buffer layer 118.

$N^+$-type regions 117, first $p^+$-type base regions 103, second $p^+$-type base regions 104, n-type high-concentration regions 105, and a p-type base layer 106 are selectively provided in the $n^-$-type silicon carbide epitaxial layer 102. Further, $n^{++}$-type source regions 107 and $p^{++}$-type contact regions 108 are selectively provided on the surface of the p-type base layer 106.

Further, trenches 116 that penetrate through the $n^{++}$-type source regions 107 and the p-type base layer 106 and reach the n-type high-concentration regions 105 are provided; along inner walls of the trenches 116, gate insulating films 109 are provided on bottoms and sidewalls of the trenches 116; and gate electrodes 110 are provided on the gate insulating films 109 in the trenches 116. Source electrodes 112 are provided on the surfaces of the $p^{++}$-type contact regions 108 and the $n^{++}$-type source regions 107; and a source electrode pad 115 is provided on the source electrodes 112. Further, in an entire area of a first main surface of a silicon carbide semiconductor base, an interlayer insulating film 111 is provided so as to cover the gate electrodes 110 embedded in the trenches 116. A barrier metal 114 is provided between the source electrodes 112 and the interlayer insulating film 111. Further, a back electrode 113 is provided on a back surface of the $n^+$-type silicon carbide substrate 101.

The vertical MOSFET having such a structure has, as body diodes between the source and drain, built-in parasitic pn diodes formed by the p-type base layer 106 and the n-type high-concentration regions 105. These parasitic pn diodes may be operated by applying a high potential to the source electrodes 112; and current flows in a direction indicated by arrow A in FIG. 9. In this manner, in a MOSFET, unlike in an IGBT, parasitic pn diodes are built in and therefore, free wheeling diodes (FWDs) used in inverters may be omitted, thereby contributing to reductions in cost and size. Hereinafter, a parasitic pn diode of a MOSFET is called a body diode.

In such a silicon carbide semiconductor device, crystal of the $n^+$-type silicon carbide substrate 101 may have defects. In this case, when current flows in a body diode, holes from the $p^{++}$-type contact regions 108 are injected and recombination of electrons and holes occurs in the $n^-$-type silicon carbide epitaxial layer 102 or in the $n^+$-type silicon carbide substrate 101. Due to recombination energy (3 eV) generated at this time corresponding to the band gap, one type of crystal defect, basal plane dislocations, are present in the $n^+$-type silicon carbide substrate 101 and move, whereby a stacking fault between two basal plane dislocations expands.

When a stacking fault expands, the stacking fault does not easily pass current and therefore, ON resistance of the MOSFET and forward current of the body diode increase. When such operation continues, expansion of the stacking fault is cumulative, whereby loss occurring in an inverter circuit increases over time and generated heat also increases, thereby causing device failure. To prevent this problem, a measure may be taken so that current does not flow to the body diode of the MOSFET by connecting a Schottky barrier diode (SiC-SBD) in antiparallel to the MOSFET.

In a method of testing a semiconductor device, a technique is known that enables large duty pulse conduction and direct current with low thermal resistance and low contact resistance by bonding a metal block plated with a metal having a low contact resistance, such as gold, to a back surface of a semiconductor device element by a bonding layer containing a conductive bonding material (for example, refer to Japanese Laid-Open Patent Publication No. 2019-021740).

SUMMARY OF THE INVENTION

According to an embodiment of the invention, a silicon carbide semiconductor device includes: a silicon carbide substrate having a first surface and a second surface opposite to each other; a first semiconductor layer of a first conductivity type, provided on the first surface of the silicon carbide substrate, the first semiconductor layer having a first surface and a second surface opposite to each other, the second surface of the first semiconductor layer facing the silicon carbide substrate; a second semiconductor layer of a second conductivity type, provided on the first surface of the first semiconductor layer; a first semiconductor region of the first conductivity type, selectively provided in the second semiconductor layer, the first semiconductor region having an impurity concentration higher than an impurity concentration of the silicon carbide substrate; a gate insulating film having a first surface and a second surface opposite to each other, the second surface of gate insulating film being in contact with the second semiconductor layer; a gate electrode provided on the first surface of the gate insulating film; a first electrode provided on surfaces of the second semiconductor layer and the first semiconductor region; and a second electrode provided on the second surface of the silicon carbide substrate. In a first region within 30 µm from a cross section of the silicon carbide semiconductor device, a roughness Rp of the second surface of the silicon carbide semiconductor device is at most 4 µm and in a second region other than the first region, the roughness Rp of the second surface of the silicon carbide semiconductor device is at most 2 µm.

Objects, features, and advantages of the present invention are specifically set forth in or will become apparent from the following detailed description of the invention when read in conjunction with the accompanying drawings.

DETAILED DESCRIPTION OF THE INVENTION

First, problems associated with the conventional techniques are discussed. Even in an instance in which a SiC-SBD is connected in antiparallel to the MOSFET, at the instant when the MOSFET switches from ON to OFF, current may be flowing in the body diode of the MOSFET and a stacking fault in the MOSFET may expand. Therefore, conventionally, screening of silicon carbide semiconductor devices is performed to thereby identify silicon carbide semiconductor devices that are free of stacking defects.

Figure 10:
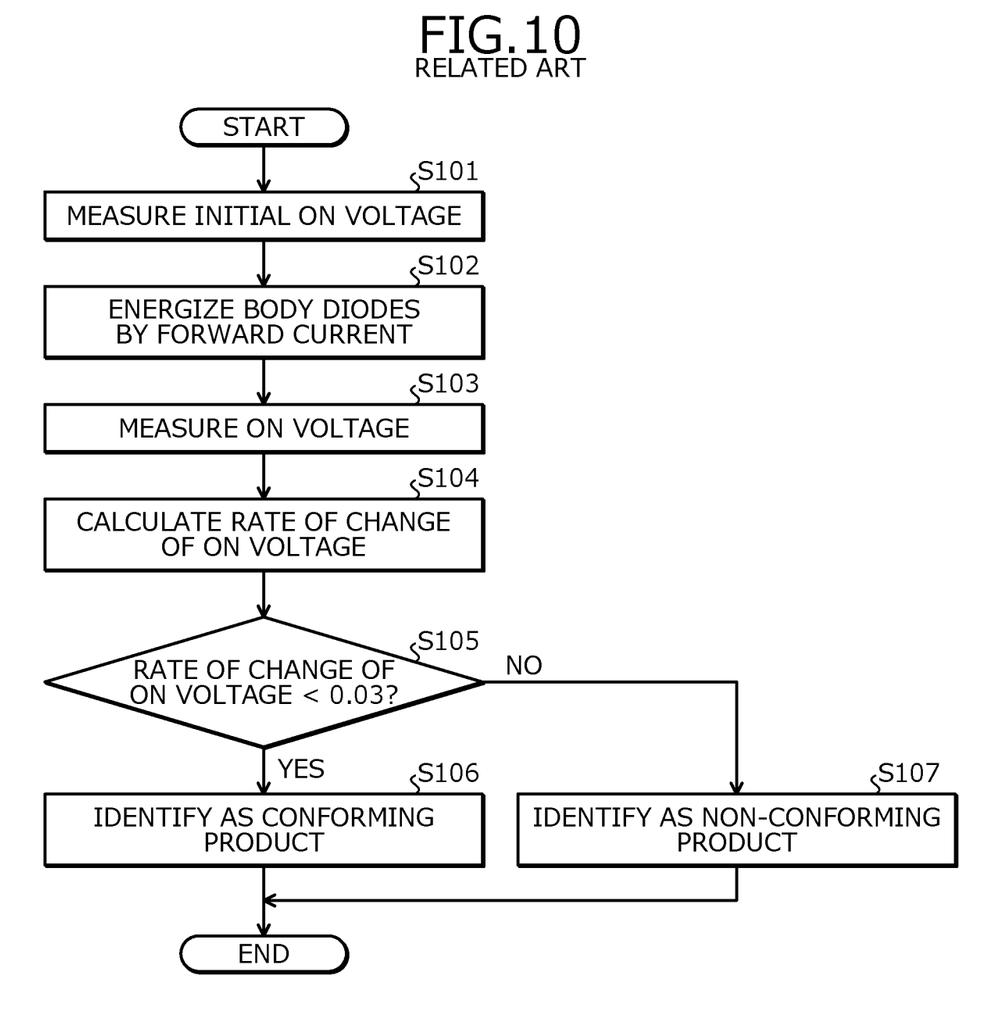
FIG. 10 is a flowchart depicting an identification method in a method of manufacturing the conventional silicon carbide semiconductor device.

FIG. 10 is a flowchart depicting an identification method in a method of manufacturing the conventional silicon carbide semiconductor device. As depicted in FIG. 10, first, an initial ON voltage (Von) is measured (step S101). Growth of stacking faults in the substrate is determined by a change in the ON voltage and therefore, the initial ON voltage is measured in advance. Here, the measured ON voltage is assumed as $Von_0$. Next, the body diode of the MOSFET is energized by forward current (step S102). In particular, a gate electrode and a source electrode of the MOSFET are short-circuited, positive current is applied to the source electrode and potential of a drain electrode is set to 0.

Next, the ON voltage is measured (step S103). Here, the measured ON voltage is assumed to be $Von_1$. Next, a rate of change of the ON voltage is calculated (step S104). The rate of change $\Delta Von$ of the ON voltage is a rate of change of the ON voltage from the initial ON voltage. For example, the rate of change $\Delta Von$ of the ON voltage may be obtained by $\Delta Von = (Von_1 - Von_0)/Von_0$.

Next, whether the rate of change $\Delta Von$ of the ON voltage<0.03 (less than 3%) is true is determined (step S105). Here, when the rate of change $\Delta Von$ of the ON voltage<0.03 is determined to be true (step S105: YES), the MOSFET is identified as a conforming product (step S106). Further, when the rate of change $\Delta Von$ of the ON voltage<0.03 is determined to be false (step S105: NO), the MOSFET is identified as a non-conforming product (step S107).

Figure 11:
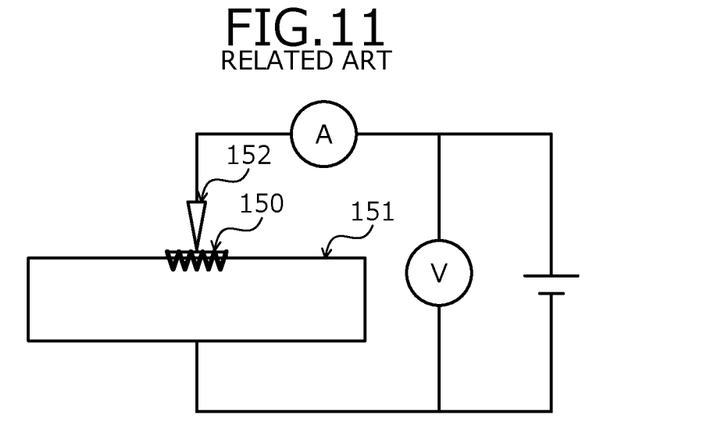
FIG. 11 is a schematic diagram of the identification method in the method of manufacturing the conventional silicon carbide semiconductor device.

FIG. 11 is a schematic diagram of the identification method in the method of manufacturing the conventional silicon carbide semiconductor device. As depicted in FIG. 11, measurement of the ON voltage is performed by placing a back surface of the trench-type MOSFET 150 on a cemented carbide stage 151 and contacting a probe 52 to a front surface of the trench-type MOSFET 150.

At this time, a large current (~100 A) is applied to the trench-type MOSFET 150, whereby variability in contact resistance among the probe 52, the trench-type MOSFET 150, and the cemented carbide stage 151 becomes large. Therefore, variability of, for example, heat generated due to the contact resistance increases, whereby measurement error increases.

Figure 12:
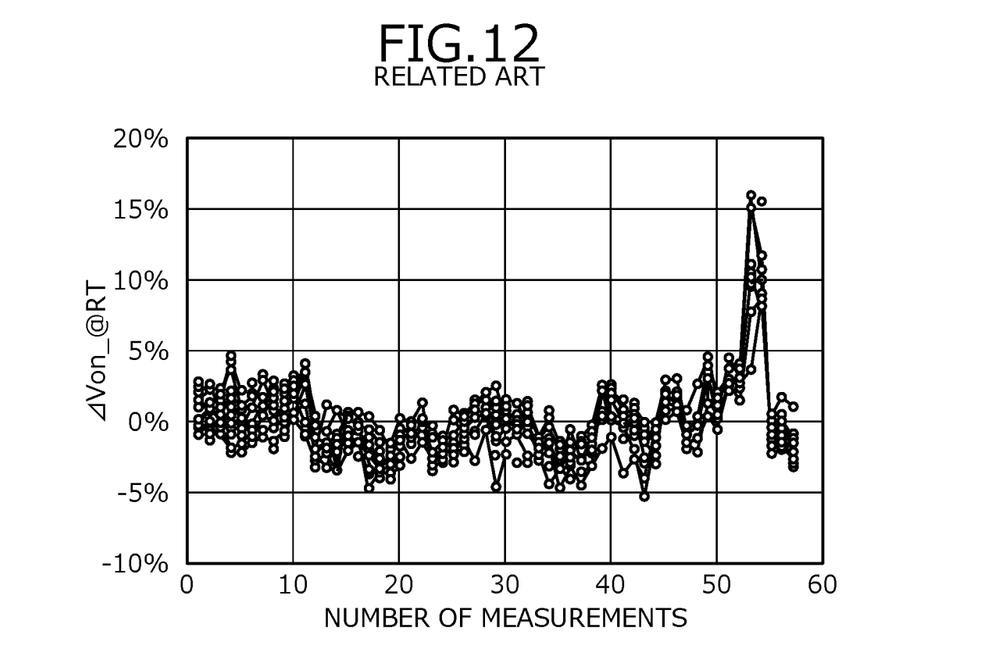
FIG. 12 is a graph depicting measurement variability of the identification method in the method of manufacturing the conventional silicon carbide semiconductor device.

FIG. 12 is a graph depicting measurement variability of the identification method in the method of manufacturing the conventional silicon carbide semiconductor device. In FIG. 12, a vertical axis indicates the rate of change ΔVon of the ON voltage measured at room temperature (RT, about 25 degrees C.) in units of percentage (%). A horizontal axis indicates the number of measurements. FIG. 12 depicts results for an instance in which fifteen (15) trench-type MOSFETs 150 were prepared and subject to screening by performing measurement of the rate of change ΔVon of the ON voltage 57 times for each of the trench-type MOSFETs 150.

As depicted in FIG. 12, in the measurements for one of the trench-type MOSFETs 150, variability of the difference of a maximum value and a minimum value of the rate of change ΔVon is 20.4%. Therefore, a problem arises in that, for the identification method in the method of manufacturing the conventional silicon carbide semiconductor device, measurement variability is σ (standard deviation)=about 1.8%; detection accuracy is 3σ=about 5.4%; and variation of 3% set as a lower detection limit of a Von variation amount could not be detected accurately.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

Figure 1:
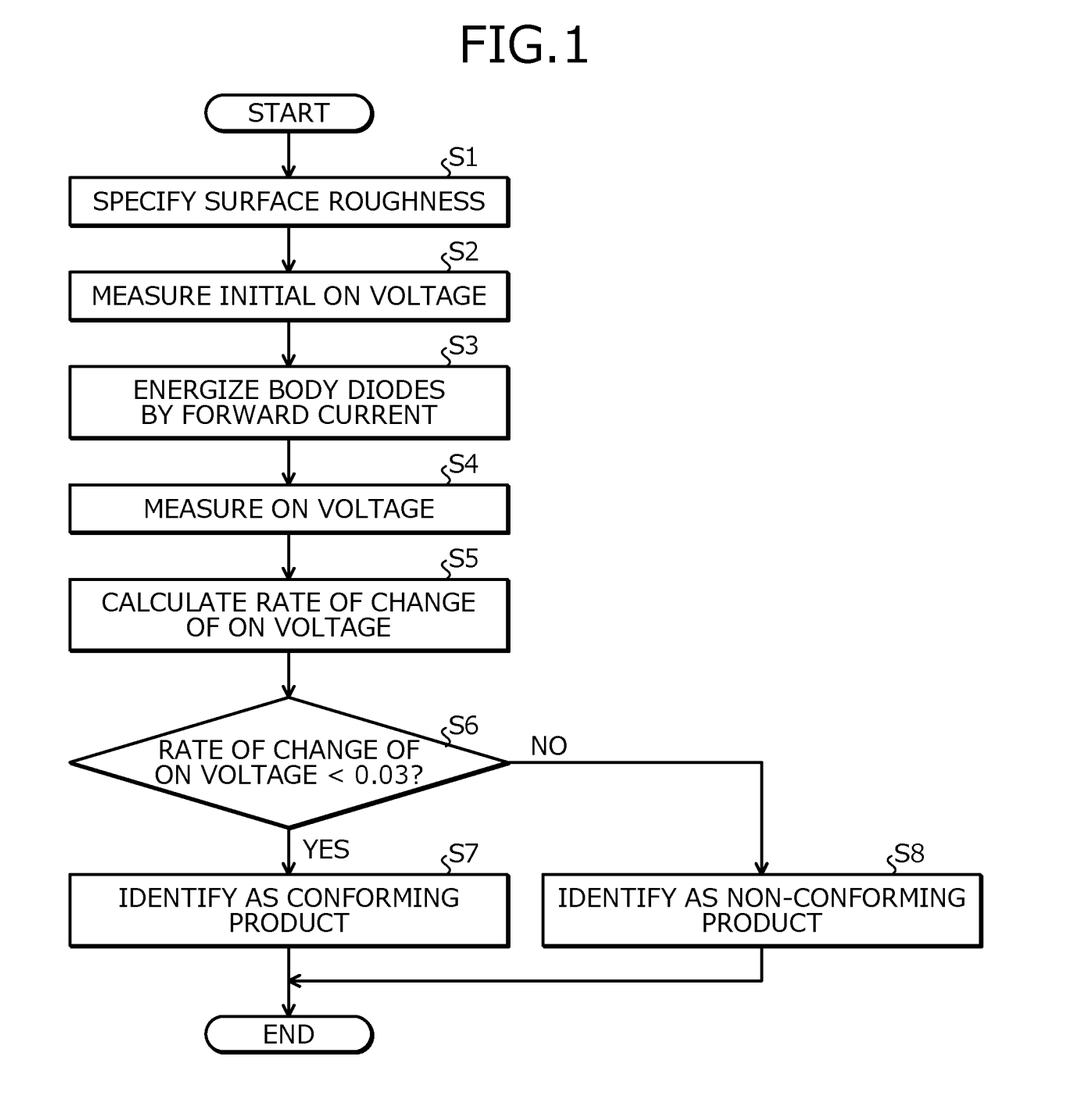
FIG. 1 is a flowchart depicting an identification method in a method of manufacturing a silicon carbide semiconductor device according to a first embodiment.
Figure 2:
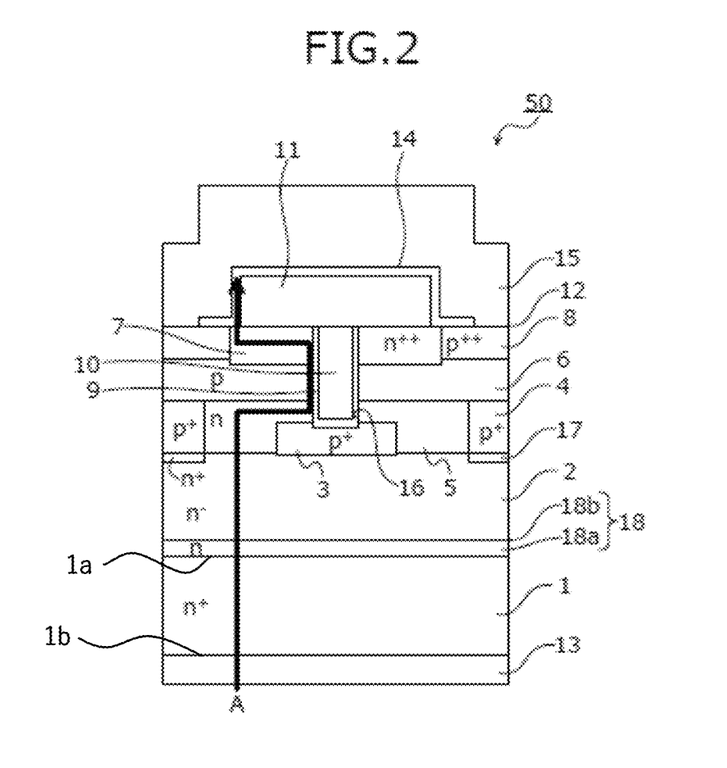
FIG. 2 is a cross-sectional view depicting a structure of the silicon carbide semiconductor device according to the first embodiment.

FIG. 1 is a flowchart depicting an identification method in a method of manufacturing a silicon carbide semiconductor device according to a first embodiment. Hereinafter, as the silicon carbide semiconductor device, while a MOSFET is described as an example, description is similar in an instance of another silicon carbide semiconductor device having a MOS gate structure. First, the silicon carbide semiconductor device according to the first embodiment is described. FIG. 2 is a cross-sectional view depicting a structure of the silicon carbide semiconductor device according to the first embodiment.

As depicted in FIG. 2, in the silicon carbide semiconductor device according to the first embodiment, an $n^-$-type silicon carbide epitaxial layer (first semiconductor layer of a first conductivity type) 2 is deposited on a first main surface (front surface) 1a, for example, a (0001)-plane (Si-face) of an $n^+$-type silicon carbide substrate (silicon carbide substrate) 1.

Further, an n-type buffer layer 18 may be provided between the $n^+$-type silicon carbide substrate 1 and the $n^-$-type silicon carbide epitaxial layer 2. The n-type buffer layer 18, for example, includes a silicon carbide epitaxial layer (an n-type low-concentration buffer layer 18a) provided on the front surface of the $n^+$-type silicon carbide substrate 1 and doped with nitrogen (N) at a concentration lower than that of the $n^+$-type silicon carbide substrate 1 and the n-type buffer layer 18 further includes a silicon carbide epitaxial layer (an n-type high-concentration buffer layer 18b) provided on a front surface of the n-type low-concentration buffer layer 18a and doped with nitrogen at a concentration higher than that of the $n^+$-type silicon carbide substrate 1. By the n-type buffer layer 18, holes generated at a pn interface are recombined in the n-type buffer layer 18 and are prevented from reaching the $n^+$-type silicon carbide substrate 1, whereby generation of stacking faults from the $n^+$-type silicon carbide substrate 1 may be prevented.

The $n^+$-type silicon carbide substrate 1 is a silicon carbide single crystal substrate. The $n^-$-type silicon carbide epitaxial layer 2 has an impurity concentration lower than the impurity concentration of the $n^+$-type silicon carbide substrate 1 and, for example, is a low-concentration n-type drift layer. At a first surface of the $n^-$-type silicon carbide epitaxial layer 2, opposite to a second surface thereof facing the $n^+$-type silicon carbide substrate 1, n-type high-concentration regions 5 may be provided. The n-type high-concentration regions 5 constitute a high-concentration n-type drift layer having an impurity concentration lower than the impurity concentration of the $n^+$-type silicon carbide substrate 1 and higher than the impurity concentration of the $n^-$-type silicon carbide epitaxial layer 2.

On the first surface of the $n^-$-type silicon carbide epitaxial layer 2, opposite to the second surface thereof facing the $n^+$-type silicon carbide substrate 1, a p-type base layer (second semiconductor layer of a second conductivity type) 6 is provided. Hereinafter, the $n^+$-type silicon carbide substrate 1, the $n^-$-type silicon carbide epitaxial layer 2, and the p-type base layer 6 combined are assumed as a silicon carbide semiconductor base.

On a second surface (back surface, i.e., a back surface of silicon carbide semiconductor base) 1b of the $n^+$-type silicon carbide substrate 1, a drain electrode constituting a back electrode (second electrode) 13 is provided. On the surface of the back electrode 13, a drain electrode pad (second electrode; not depicted) is provided.

In the silicon carbide semiconductor base, at the first main surface side thereof (side having the p-type base layer 6), a trench gate structure is formed. In particular from a first surface of the p-type base layer 6 (the first main surface side of the silicon carbide semiconductor base), opposite to a second surface of the p-type base layer 6 facing the $n^+$-type silicon carbide substrate 1, trenches 16 penetrate through the p-type base layer 6 and reach the n-type high-concentration regions 5 (in an instance in which the n-type high-concentration regions 5 are omitted, the $n^-$-type silicon carbide epitaxial layer 2, hereinafter, simply "(2)"). The trenches 16 have a striped pattern in a plan view thereof. Along inner walls of the trenches 16, gate insulating films 9 are formed on bottoms and sidewall of the trenches 16, and gate electrodes 10 are formed on the gate insulating films 9 in the trenches 16. The gate electrodes 10 are insulated from the $n^-$-type silicon carbide epitaxial layer 2 and the p-type base layer 6 by the gate insulating films 9. The gate electrodes 10 may partially protrude toward a source electrode pad 15 from tops (sides where the source electrode pad 15 is provided) of the trenches 16.

In surface layers of the n-type high-concentration regions 5 (2) at first surfaces thereof (first main surface side of the silicon carbide semiconductor base) opposite to second surfaces thereof facing the $n^+$-type silicon carbide substrate 1, second $p^+$-type base regions 4 are selectively provided. Beneath the trenches 16, first $p^+$-type base regions 3 are provided and a width of each of the first $p^+$-type base regions 3 is wider than a width of each of the trenches 16. The first $p^+$-type base regions 3 and the second $p^+$-type base regions 4, for example, are doped with aluminum. In FIG. 2, while the first $p^+$-type base regions 3 are in contact with the bottoms of the trenches 16, the first $p^+$-type base regions 3 may be provided at positions deeper than the bottoms of the trenches 16. The first $p^+$-type base regions 3 reach deep positions closer to the drain than are the bottoms of the trenches 16.

The first $p^+$-type base regions 3 and the second $p^+$-type base regions 4 are provided, whereby pn junctions between the first $p^+$-type base regions 3, the second $p^+$-type base regions 4 and the n-type high-concentration regions 5 (2) may be formed at positions close to the bottoms of the trenches 16 in a depth direction (direction from source electrodes (first electrodes) 12 to the back electrode 13). In this manner, pn junctions between the first $p^+$-type base regions 3, the second $p^4$-type base regions 4 and the n-type high-concentration regions 5 (2) are formed, whereby application of high electric field to the gate insulating films 9 at the bottoms of the trenches 16 may be prevented. Therefore, even in an instance in which a wide band gap semiconductor is used as a semiconductor material, increased breakdown voltage and current are possible.

In the $n^-$-type silicon carbide epitaxial layer 2, $n^+$-type regions 17 having an impurity concentration higher than the impurity concentration of the n-type high-concentration regions 5 (2) may be provided respectively between adjacent trenches of the trenches 16, at positions deeper than the second $p^+$-type base regions 4. The $n^+$-type regions 17 may have a peak impurity concentration higher than the impurity concentration of the n-type high-concentration regions 5 (2) or the impurity concentration in all the regions of the $n^+$-type regions 17 may not be higher than the impurity concentration of the n-type high-concentration regions 5 (2). Further, in an embodiment in which the n-type high-concentration regions 5 are omitted, the peak impurity concentration of the $n^+$-type regions 17 is higher than the impurity concentration of the $n^-$-type silicon carbide epitaxial layer 2. Moreover, preferably, the impurity concentration of the $n^+$-type regions 17 may be lower than the impurity concentration of the second $p^+$-type base regions 4.

Due to the $n^+$-type regions 17, regions that determine the breakdown voltage of the device element may be set to be the second $p^+$-type base regions 4 between the trenches 16, not the first $p^+$-type base regions 3 of the bottoms of the trenches 16. In other words, the breakdown voltage of the first $p^+$-type base regions 3 of the bottoms of the trenches 16 may be increased to be higher than the breakdown voltage of the second $p^+$-type base regions 4 between the trenches 16.

Further, in the p-type base layer 6, $n^{++}$-type source regions (first semiconductor regions of the first conductivity type) 7 are selectively provided at the first main surface side of the silicon carbide semiconductor base. $P^{++}$-type contact regions 8 may also be selectively provided. Further, the $n^{++}$-type source regions 7 and the $p^{++}$-type contact regions 8 are in contact with one another. Further, the $p^{++}$-type contact regions 8 may be selectively provided in a direction along which the trenches 16 extend in a striped shape.

An interlayer insulating film 11 is provided in an entire area of the first main surface of the silicon carbide semiconductor base, so as to cover the gate electrodes 10 embedded in the trenches 16. The source electrodes 12, via contact holes opened in the interlayer insulating film 11, are in contact with the $n^{++}$-type source regions 7 and the $p^{++}$-type contact regions 8 (in an instance in which the $p^{++}$-type contact regions 8 are omitted, the p-type base layer 6). The source electrodes 12 are electrically insulated from the gate electrodes 10 by the interlayer insulating film 11. On the source electrodes 12, the source electrode pad 15 is provided. Between the source electrodes 12 and the interlayer insulating film 11, for example, a barrier metal 14 that prevents diffusion of metal atoms from the source electrodes 12 to the gate electrodes 10 may be provided.

In FIG. 2, while a single cell (structure including one of the trenches 16, one of the gate insulating films 9, one of the gate electrodes 10, the interlayer insulating film 11, and one of the source electrodes 12) is depicted, MOS gate (insulated gates including a metal, an oxide film, and a semiconductor) structures of further cells may be disposed in parallel.

Figure 13:
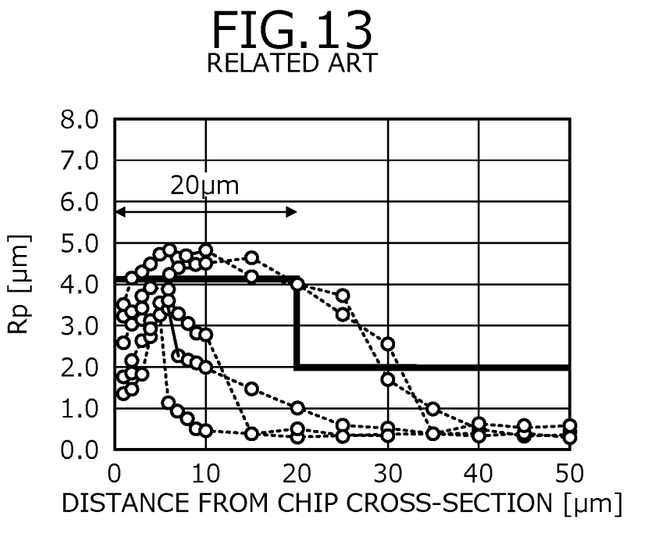
FIG. 13 is a graph depicting chip back-surface roughness Rp of the conventional silicon carbide semiconductor device.

The identification method in the method of manufacturing the silicon carbide semiconductor device according to the first embodiment is described with reference to FIG. 1. Here, FIG. 13 is a graph depicting the chip back-surface roughness Rp of the conventional silicon carbide semiconductor device. The roughness Rp is a height of a portion that is highest from the chip back surface. In FIG. 13, a vertical axis indicates the chip back-surface roughness Rp and a horizontal axis indicates distance from a chip cross section (cross-sectional surface (lateral surface including all side surfaces) of silicon carbide semiconductor device). The chip cross section is a cut surface of an individual silicon carbide semiconductor device (semiconductor chip) resulting from dicing after formation of the silicon carbide semiconductor device on a silicon carbide semiconductor wafer. As depicted in FIG. 13, chip back-surface roughness Rp exceeding 4 μm is present in a region within 20 μm of the chip cross section, and chip back-surface roughness Rp exceeding 2 μm is present in regions other than the regions within 20 μm of the chip cross section. In this manner, in the conventional silicon carbide semiconductor device, the chip back-surface roughness Rp is large and therefore, variation of contact resistance between the back surface of the trench-type MOSFET 150 and the cemented carbide stage 151 is large, whereby measurement error is large.

Figure 3:
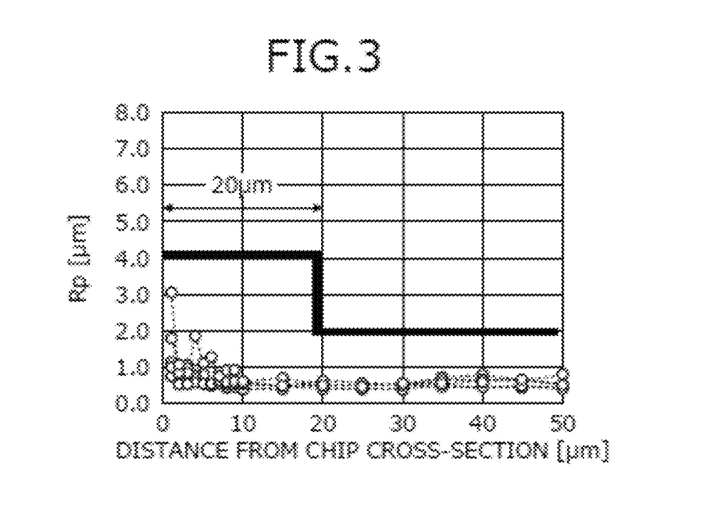
FIG. 3 is a graph depicting chip back-surface roughness Rp of the silicon carbide semiconductor device according to the first embodiment.

Thus, in the silicon carbide semiconductor device according to the first embodiment, roughness (Rp) of a back surface of a trench-type MOSFET 50 is specified (step S1, first process). FIG. 3 is a graph depicting chip back-surface roughness Rp of the silicon carbide semiconductor device according to the first embodiment. In FIG. 3, a vertical axis indicates the chip back-surface roughness Rp and a horizontal axis indicates distance from a chip cross section. As depicted in FIG. 3, the back surface of the MOSFET 50 has a region (first region) within 30 μm of the chip cross section The chip back-surface roughness Rp (first roughness Rp) in the first region is specified to be at most 4 μm. The back surface of the MOSFET 50 has another region (second region) other than the region within 30 μm of the chip cross section, i.e., a region inside of the first region. The chip back-surface roughness Rp (second roughness Rp) in the second region is specified to be at most 2 μm. More preferably, in a region of the back surface within 20 μm of the chip cross section, the chip back-surface roughness Rp (first roughness Rp) is specified to be at most 4 μm and in a region of the back surface inside the region within 20 μm of the chip cross section, the chip back-surface roughness Rp (second roughness Rp) is specified to be at most 2 μm.

The chip back-surface roughness occurs when a silicon carbide semiconductor wafer is diced and some of the roughness may be caused by burrs having a zigzag shape. Therefore, by performing the dicing from the front surface of the silicon carbide semiconductor wafer that is opposite to the back surface of the silicon carbide semiconductor wafer that forms the back surface of the MOSFET, or by performing the dicing according to an off-angle of the silicon carbide semiconductor wafer, or by performing the dicing by a laser, the chip back-surface roughness Rp may be set to be within the range described above. Further, the roughness (Rp) of the back surface of the MOSFET may be measured and only the MOSFETs that are within the range above may be selected in advance.

Next, the initial ON voltage is measured (step S2, second process). To determine substrate stacking fault growth from variation of the ON voltage, the initial ON voltage is measured in advance. The ON voltage is a difference in potential between the drain electrode and the source electrodes when the MOSFET is ON, in other words, when gate voltage gradually increases and current flows from the drain electrode to the source electrodes when positive voltage is applied to the drain electrode, or when current flows from the source electrodes to the drain electrode. Here, the measured ON voltage is assumed as $Von_0$.

For example, the ON voltage of the MOSFET may be measured by determining a voltage Vdson between the source and the drain when current of a predetermined current value flows from the drain electrode to the source electrodes when positive voltage is applied to the drain electrode while the potential of the source electrodes is set to 0. At this time, current flows along path A in FIG. 2 described above.

Next, body diodes of the MOSFET are energized by forward current (step S3, third process). In particular, the gate electrodes and the source electrodes of the MOSFET are short-circuited or negative bias is applied, positive voltage is applied to the source electrodes, and the potential of the drain electrode is set to 0. Further, in the first embodiment, DC or forward current for which the frequency is at most 100 kHz is passed. Forward current of the body diodes is current that flows from the source electrodes to the drain electrode in the diodes formed between the source and drain of the MOSFET. Further, the forward current of the body diodes may be caused to flow by applying negative voltage to the drain electrode in a state in which the potential of the source electrodes is set to 0.

Next, the ON voltage is measured (step S4, fourth process). The ON voltage is measured by a method similar to that at step S2. Here, the measured voltage is assumed as $Von_1$. Next, the rate of change of the ON voltage is calculated (step S5, fifth process). The rate of change ΔVon of the ON voltage is the rate of change of the ON voltage from the initial ON voltage. For example, the rate of change ΔVon of the ON voltage is obtained by $\Delta Von=(Von_1-Von_0)/Von_0$.

Next, whether the rate of change of the ON voltage<0.03 (less than 3%) is true is determined (step S6, sixth process). Here, when the rate of change of the ON voltage<0.03 is determined to be true (step S6: YES), the MOSFET is identified as a conforming product (step S7). On the other hand, when the rate of change of the ON voltage<0.03 is determined to be false (step S6: NO), the MOSFET is identified as a non-conforming product (step S8).

Figure 4:
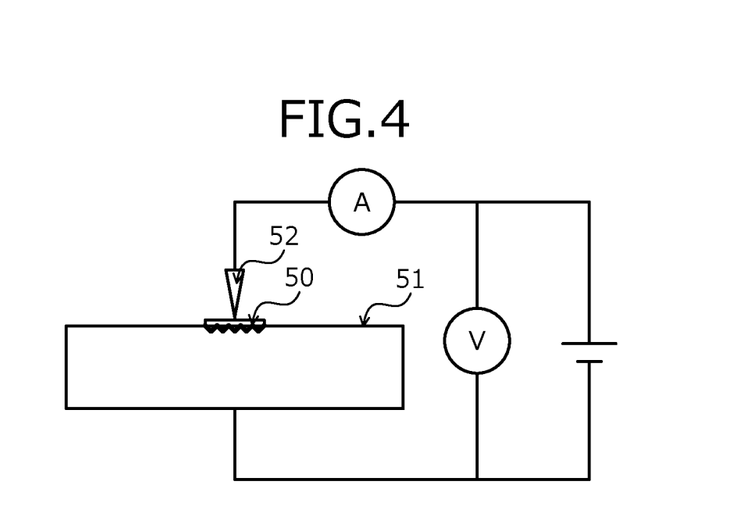
FIG. 4 is a schematic diagram of an identification method in a method of manufacturing the silicon carbide semiconductor device according to the first embodiment.

FIG. 4 is a schematic diagram of the identification method in the method of manufacturing the silicon carbide semiconductor device according to the first embodiment. As depicted in FIG. 4, measurement of the ON voltage is performed by placing the back surface of the trench-type MOSFET 50 on a cemented carbide stage 51 and contacting a probe 52 to the front surface of the trench-type MOSFET 50.

In the first embodiment, the roughness of the back surface of the trench-type MOSFET 50 is specified, whereby variation of the contact resistance between the probe 52, the trench-type MOSFET 50, and the cemented carbide stage 51 is small even when a large current (~100 A) is applied to the trench-type MOSFET 50. Therefore, variation of heat generation due to contact resistance is small, whereby measurement error is small.

Figure 5:
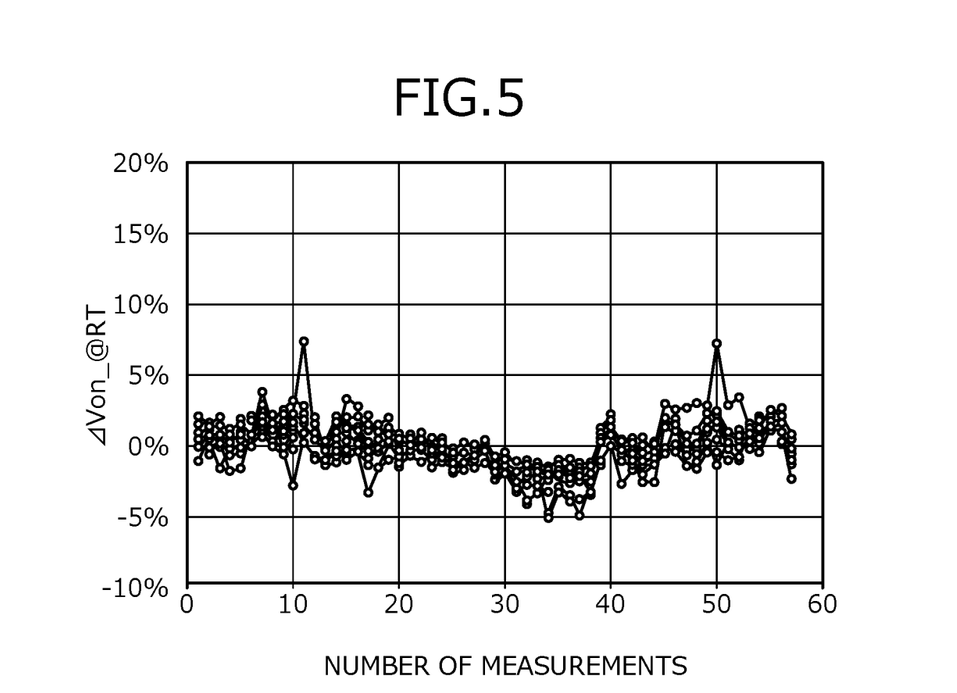
FIG. 5 is a graph depicting measurement variability of the identification method in the method of manufacturing the silicon carbide semiconductor device according to the first embodiment.

FIG. 5 is a graph depicting measurement variability of the identification method in the method of manufacturing the silicon carbide semiconductor device according to the first embodiment. In FIG. 5, a vertical axis indicates in units of percentage (%), the rate of change ΔVon of the ON voltage measured at room temperature (RT, about 25 degrees C.). A horizontal axis indicates the number of measurements. FIG. 5 depicts results for an instance in which fifteen (15) trench-type MOSFETs 50 were prepared and subject to screening by performing measurement of the rate of change ΔVon of the ON voltage 57 times for each of the trench-type MOSFETs 50.

As depicted in FIG. 5, in measurements performed with respect to one of the trench-type MOSFETs 50, variation of the difference of a maximum value and a minimum value of the rate of change ΔVon for said trench-type MOSFET 50 is 12.18%. Therefore, in the method of manufacturing the silicon carbide semiconductor device according to the first embodiment, measurement variability is low at σ=about 1.09% and variation of 3% set as a lower detection limit of the Von variation amount may be detected with high accuracy of 5.5σ.

As described above, in the silicon carbide semiconductor device according to the first embodiment, the roughness of the back surface of the MOSFET is specified. As a result, in the identification method, variation of contact resistance is small, measurement error may be reduced, and the accuracy of Von measurement during measurement of electrical characteristics may be enhanced. Thus, a MOSFET in which Von varies after body diode energization may be accurately identified.

Next, a second embodiment is described. A structure of a silicon carbide semiconductor device according to the second embodiment and a flowchart of an identification method in the method of manufacturing are the same as those of the first embodiment and therefore, description thereof is omitted hereinafter.

Figure 6:
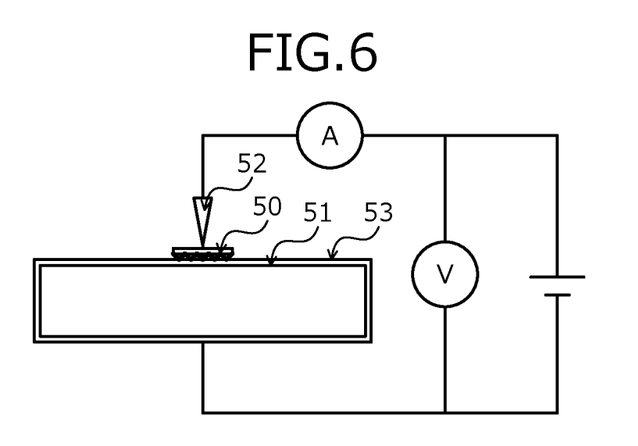
FIG. 6 is a schematic diagram of an identification method in a method of manufacturing a silicon carbide semiconductor device according to a second embodiment.

FIG. 6 is a schematic diagram of the identification method in a method of manufacturing the silicon carbide semiconductor device according to the second embodiment. The schematic diagram according to the second embodiment differs from the schematic diagram according to the first embodiment in that the surface of the cemented carbide stage 51 is covered by a metal plating 53.

Gold (Au) that is a material of the metal plating 53 is soft and unevenness of the back surface of the trench-type MOSFET 50 bites into the metal plating 53, whereby contact between the back surface of the trench-type MOSFET 50 and the cemented carbide stage 51 may be improved. Further, to achieve sufficient biting-in of the unevenness of the back surface, preferably, a thickness of the metal plating 53 may be at least 1 μm. Further, gold is resistant to oxidation and therefore, unevenness occurring on the cemented carbide stage 51 due to an oxide film may be prevented.

Figure 7:
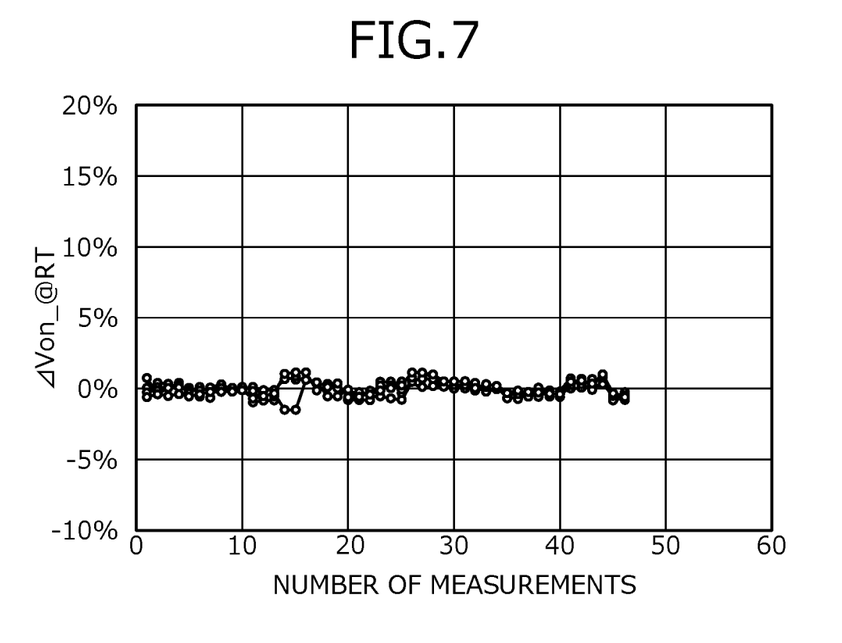
FIG. 7 is a graph depicting measurement variability of the identification method in the method of manufacturing the silicon carbide semiconductor device according to the second embodiment.

FIG. 7 is a graph depicting measurement variability of the identification method in the method of manufacturing the silicon carbide semiconductor device according to the second embodiment. In FIG. 7, a vertical axis indicates, in units of percentage (%), the rate of change ΔVon of the ON voltage measured at room temperature (RT, about 25 degrees C.). A horizontal axis indicates the number of measurements. FIG. 7 depicts results for an instance in which twenty (20) of the trench-type MOSFETs 50 were prepared and subject to screening by performing measurement of the rate of change ΔVon of the ON voltage performed 46 times for each of the trench-type MOSFETs 50.

As depicted in FIG. 7, in measurements performed with respect to one of the trench-type MOSFETs 50, variation of the difference of a maximum value and a minimum value of the rate of change ΔVon for said trench-type MOSFET 50 is 2.53%. Therefore, in the method of manufacturing the silicon carbide semiconductor device according to the second embodiment, measurement variability is σ=about 0.55%, lower than that in the first embodiment, and variation of 3% set as a lower detection limit of the Von variation amount may be detected with high accuracy of 5.5σ.

As described above, in the identification method in the method of manufacturing the silicon carbide semiconductor device according to the second embodiment, the surface of the cemented carbide stage is covered by a gold plating, whereby contact between the back surface of the trench-type MOSFET and the cemented carbide stage may be improved. As a result, compared to the first embodiment, variation of the contact resistance is further reduced, measurement error is further reduced, and the accuracy of the Von measurement during measurement of electrical characteristics may be further enhanced. Thus, a MOSFET in which Von varies after body diode energization may be accurately identified.

Figure 8:
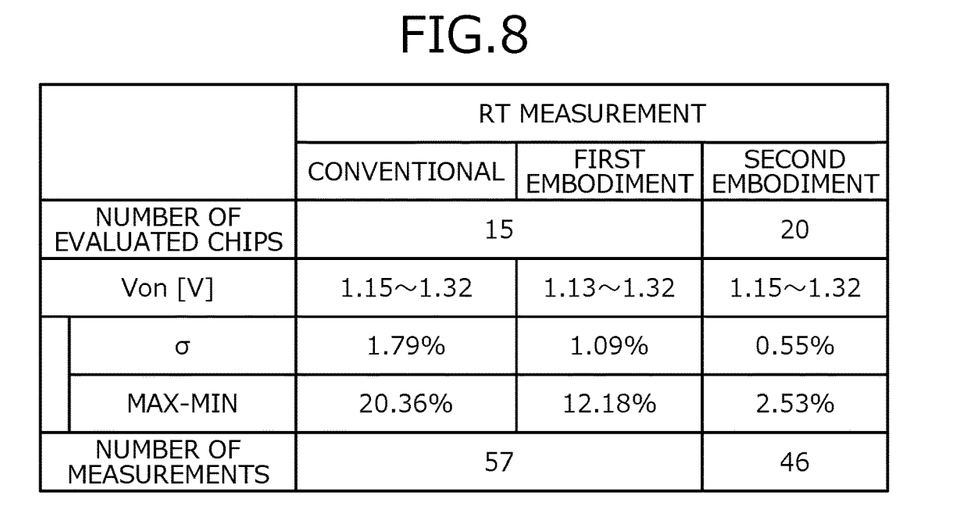
FIG. 8 is a table depicting identification methods in methods of manufacturing silicon carbide semiconductor devices conventionally and according to the first and the second embodiments.

FIG. 8 is a table depicting the identification methods in the methods of manufacturing the silicon carbide semiconductor devices conventionally and according to the first and the second embodiments. FIG. 8 is a table summarizing the items described above and in FIG. 8, Von indicates measurement results of Von after body diode energization; σ is the standard deviation of the Von variation amount; and MAX-MIN indicates the difference of the maximum value and the minimum value of the rate of change ΔVon.

In the foregoing, the present invention may be variously modified within a range not departing from the spirit of the invention and, for example, in the embodiments described above, dimensions and impurity concentrations of parts, etc. may be variously set according to necessary specifications. Further, in the embodiments described above, while an instance in which silicon carbide is used as a wide band gap semiconductor is described as an example, application is further possible to a wide band gap semiconductor other than silicon carbide such as, for example, gallium nitride (GaN). Further, regarding the MOSFET, while a trench-type has been described as an example, application is further possible to a planar-type MOSFET. Further, in the embodiments, while the first conductivity type is assumed to be an n-type and the second conductivity type is assumed to be a p-type, the present invention is similarly implemented when the first conductivity type is a p-type and the second conductivity type is an n-type.

According to the invention described above, the roughness of the back surface of the MOSFET is specified. As a result, in the identification method, variation of the contact resistance is reduced, measurement error may be reduced, and the accuracy of Von measurement during measurement of electrical characteristics may be enhanced. Thus, a MOSFET in which Von varies after body diode energization may be accurately identified.

The silicon carbide semiconductor device and the method of manufacturing a silicon carbide semiconductor device according to the present invention achieve an effect in that the accuracy of Von measurement is enhanced, whereby a device in which Von varies after body diode energization may be accurately identified.

In this manner, the silicon carbide semiconductor device and the method of manufacturing a silicon carbide semiconductor device according to the present invention are useful for silicon carbide semiconductor devices used in an inverter circuit connecting a diode in antiparallel to a silicon carbide semiconductor device.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device having a back surface and a lateral surface that forms a chip cross section, the silicon carbide semiconductor device comprising:
   a silicon carbide substrate having a first surface and a second surface that are opposite to each other and are parallel to the back surface of the silicon carbide semiconductor device;
   a first semiconductor layer of a first conductivity type, provided on the first surface of the silicon carbide substrate, the first semiconductor layer having a first surface and a second surface opposite to each other, the second surface of the first semiconductor layer facing the silicon carbide substrate;
   a second semiconductor layer of a second conductivity type, provided on the first surface of the first semiconductor layer;
   a first semiconductor region of the first conductivity type, selectively provided in the second semiconductor layer, the first semiconductor region having an impurity concentration higher than an impurity concentration of the silicon carbide substrate;
   a gate insulating film having a first surface and a second surface opposite to each other, the second surface of the gate insulating film being in contact with the second semiconductor layer;
   a gate electrode provided on the first surface of the gate insulating film;
   a first electrode provided on surfaces of the second semiconductor layer and the first semiconductor region; and
   a second electrode provided on the second surface of the silicon carbide substrate, wherein
   the back surface of the silicon carbide semiconductor device has a first region within 30 μm of the lateral surface of the silicon carbide semiconductor device and a second region other than the first region, and at the back surface of the silicon carbide semiconductor device, the first and second regions have a surface roughness Rp greater than zero, the first region is free of any surface roughness Rp exceeding 4 µm, and the second region is free of any surface roughness Rp exceeding 2 µm, the back surface of the silicon carbide semiconductor device being a back surface of the second electrode.

2. A method of manufacturing the silicon carbide semiconductor device according to claim 1, the method comprising:
preparing the silicon carbide semiconductor device having a MOS gate structure that specifies the roughness Rp of the back surface;
measuring a first value of an ON voltage of the silicon carbide semiconductor device;
passing a forward current through a body diode of the silicon carbide semiconductor device;
measuring a second value of the ON voltage of the silicon carbide semiconductor device after the device passes the forward current;
calculating a rate of change of the ON voltage, from the measured first value to the measured second value; and
identifying the silicon carbide semiconductor device for which the calculated rate of change is less than 3%.

3. The method according to claim 2, wherein
the silicon carbide semiconductor device has a lateral surface that is orthogonal to the back surface of the silicon carbide semiconductor device,
the preparing includes setting the roughness Rp of the back surface in the first region that is a region within 30 µm of the lateral surface of the silicon carbide semiconductor device to be at most 4 µm, and setting the roughness Rp of the back surface in the second region other than the first region to be at most 2 µm.

4. The method according to claim 3, wherein
the preparing includes adjusting the roughness Rp of the back surface of the silicon carbide substrate, or selecting the silicon carbide semiconductor device, to meet a condition in which the roughness Rp of the back surface in the first region is at most 4 µm and the roughness Rp of the back surface in the second region is at most 2 µm.

5. The method according to claim 2, wherein
the measuring the first value of the ON voltage and measuring the second value of the ON voltage include placing the silicon carbide semiconductor device on a stage to measure the ON voltage, the stage being treated with a gold plating.

6. The method according to claim 5, wherein
a thickness of the gold plating is at least 1 µm.

7. The silicon carbide semiconductor device according to claim 1, wherein a rate of change of an ON voltage ($\Delta$Von) of the silicon carbide semiconductor device is less than 3%, wherein $\Delta$Von is defined as follows:

$$\Delta Von = (Von_1 - Von_0)/Von_0$$

where $Von_0$ is defined as a voltage difference between the first electrode and the second electrode in a state in which a current flows in the silicon carbide semiconductor device from the second electrode to the first electrode, and $Von_1$ is defined as a voltage difference between the first electrode and the second electrode in a state in which a current flows from the second electrode to the first electrode after flowing a forward current in the silicon carbide semiconductor device.

* * * * *